(12) United States Patent
Uemura

(10) Patent No.: US 11,326,901 B2
(45) Date of Patent: May 10, 2022

(54) MAGNETIC SUBSTANCE DETECTION SENSOR

(71) Applicant: ABLIC Inc., Tokyo (JP)

(72) Inventor: Hirotaka Uemura, Tokyo (JP)

(73) Assignee: ABLIC INC., Tokyo (JP)

( * ) Notice: Subject to any disclaimer, the term of this patent is extended or adjusted under 35 U.S.C. 154(b) by 132 days.

(21) Appl. No.: 17/010,369

(22) Filed: Sep. 2, 2020

(65) Prior Publication Data

US 2021/0080289 A1 Mar. 18, 2021

(30) Foreign Application Priority Data

Sep. 17, 2019 (JP) .............................. JP2019-168285

(51) Int. Cl.
G01D 5/14 (2006.01)
G01D 11/24 (2006.01)
G01R 33/07 (2006.01)

(52) U.S. Cl.
CPC ........... *G01D 5/147* (2013.01); *G01D 11/245* (2013.01); *G01R 33/07* (2013.01)

(58) Field of Classification Search
CPC ..... G01D 11/245; G01R 33/07; G01R 33/072
See application file for complete search history.

(56) References Cited

U.S. PATENT DOCUMENTS

| 8,089,276 | B2 | 1/2012 | Kentsch | |
|---|---|---|---|---|
| 2012/0217960 | A1* | 8/2012 | Ausserlechner | ... G01R 33/0206 324/252 |
| 2017/0052233 | A1* | 2/2017 | Ogomi | ............... G01R 33/0005 |
| 2017/0122776 | A1* | 5/2017 | Sato | ........................ G01D 5/145 |
| 2017/0328963 | A1* | 11/2017 | Schmitt | .............. G01R 33/0052 |
| 2018/0031643 | A1* | 2/2018 | Kaufmann | ......... G01R 33/0011 |

* cited by examiner

Primary Examiner — Alvaro E Fortich
(74) Attorney, Agent, or Firm — Crowell & Moring LLP

(57) ABSTRACT

A magnetic substance detection sensor includes a first support substrate, a magnet disposed on the upper main surface of the first support substrate so that a magnetization direction becomes parallel to the upper main surface of the first support substrate, a semiconductor chip disposed on the upper main surface of the first support substrate and having a magnetic field detection element configured to detect a magnetic field component in a specific direction, and a soft magnetic substance film disposed on the lower main surface of the first support substrate and extending in a direction parallel to the magnetization direction of the magnet.

8 Claims, 4 Drawing Sheets

MAGNETIC SUBSTANCE DETECTION SENSOR

RELATED APPLICATIONS

This application claims priority to Japanese Patent Application No. 2019-168285, filed on Sep. 17, 2019, the entire content of which is incorporated herein by reference.

BACKGROUND OF THE INVENTION

1. Field of the Invention

The present invention relates to a magnetic substance detection sensor.

2. Description of the Related Art

A magnetic substance detection sensor which detects the presence of a magnetic substance by the combination of a magnetic field detection element and a permanent magnet has heretofore been proposed (refer to, for example, U.S. Pat. No. 8,089,276). The magnetic substance as an object of detection may include a metal material such as steel which has a small permanent magnetization and a large permeability, magnetic paint containing magnetic substance particles, and the like. The magnetic substance detection sensor is used for rotation detection of a gear, pattern detection of the magnetic paint, and the like. As compared with a general magnetic sensor which detects the proximity of the permanent magnet, the magnetic substance detection sensor is capable of easily realizing non-contact proximity detection because the object of detection is not required to be magnetized.

U.S. Pat. No. 8,089,276 discloses a magnetic substance detection sensor in which the permanent magnet and the magnetic field detection element are disposed on an approximately same plane side by side, and are sealed collectively by a single resin. FIGS. 4A and 4B exemplify distributions of magnetic fields generated around a magnetic substance detection sensor 400 having a configuration similar to that of the above magnetic substance detection sensor in the cases where the magnetic substance detection sensor 400 is brought close to a wall surface W1 of a non-magnetic substance and a wall surface W2 of a soft magnetic substance. The magnetic substance detection sensor 400 includes a magnet 402 and a semiconductor chip 404 having a magnetic field detection element 403 both disposed on one main surface of a support substrate 401.

It is known that as illustrated in FIGS. 4A and 4B, the distribution of the magnetic fields around the conventional magnetic substance detection sensor changes under the influence of other structures existing in the periphery. For example, in a case of detecting a magnetic substance which approaches from the opposite side of the wall by a magnetic substance detection sensor, such as disclosed in U.S. Pat. No. 8,089,276, which is stuck to the wall, hence an output signal from the sensor changes depending on not only the distance to the magnetic substance as an object of detection, but also the material of the wall surface.

More specifically, a large offset occurs in the output signal depending on whether the material of the wall surface is a magnetic substance or a non-magnetic substance, even in the absence of the magnetic substance as an object of detection. Also, depending on whether the material of the wall surface is a magnetic substance or a non-magnetic substance, the magnitude of the amount of change in the magnetic field also changes by the approach of the object of detection, thereby generating a deviation in sensitivity. For this reason, it is difficult to obtain the accurate distance to the detected magnetic substance due to the influence of the wall by the use of the conventional magnetic substance detection sensor.

SUMMARY OF THE INVENTION

It is an object of the present invention to provide a magnetic substance detection sensor which is capable of suppressing the occurrence of an offset and the deviation in sensitivity due to the influence of a peripheral structure so that operating point does not easily shift in the detection of a magnetic substance.

The present invention adopts the following structure.

A magnetic substance detection sensor according to one aspect of the present invention includes a first support substrate having an upper main surface and a lower main surface, a magnet disposed on the upper main surface of the first support substrate so that a magnetization direction becomes parallel to the upper main surface, a semiconductor chip disposed on the upper main surface of the first support substrate and having a magnetic field detection element configured to detect a magnetic field component in a specific direction, and a soft magnetic substance film disposed on a lower main surface of the first support substrate and extending in a direction parallel to the magnetization direction of the magnet.

According to the present invention, there can be provided a magnetic substance detection sensor capable of suppressing a shift in operating point at the detection of a magnetic substance due to the influence of a peripheral structure.

DETAILED DESCRIPTION OF THE PREFERRED EMBODIMENTS

Magnetic substance detection sensors according to embodiments of the present invention will hereinafter be described in detail with reference to the accompanying drawings. The drawings used in the following description may show distinctive parts which are enlarged for convenience in order to make the features easier to understand, and the dimension ratios of the respective components or the like are not necessarily the same as the actual ones. In addition, the materials, dimensions, and the like exemplified in the following description are examples, and the present invention is not limited to them, and can be appropriately changed and implemented within the scope not changing the gist thereof.

First Embodiment

Figure 1A:
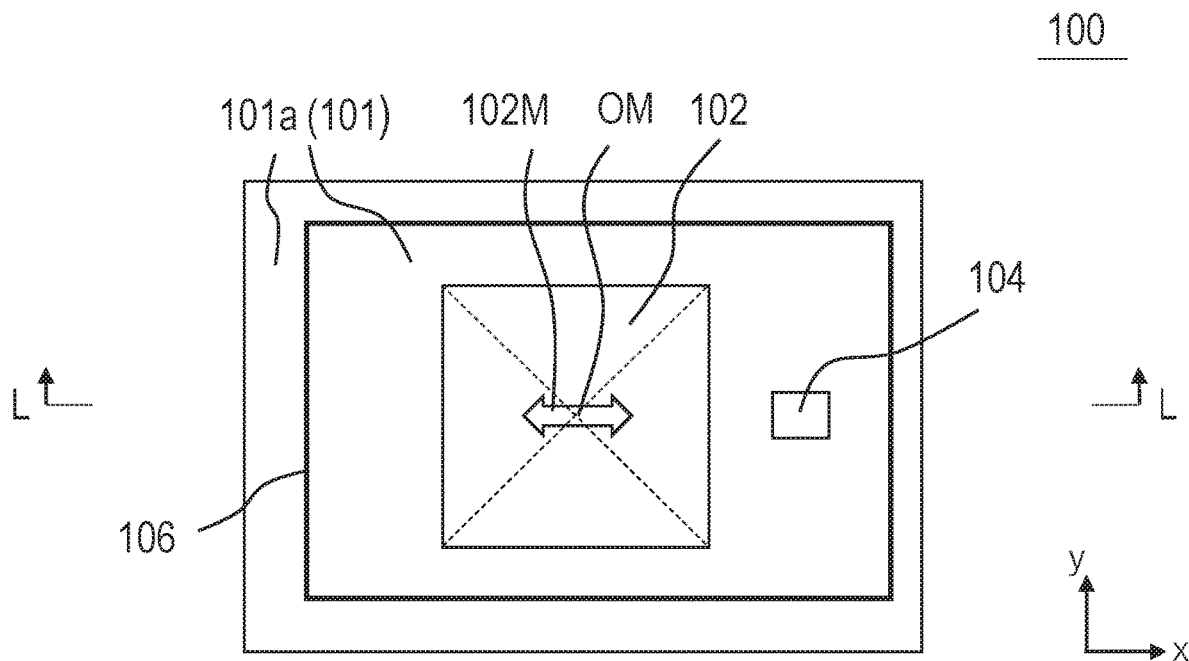
FIGS. 1A and 1B are respectively a plan view and a sectional view of a magnetic substance detection sensor according to the first embodiment of the present invention.
Figure 1B:
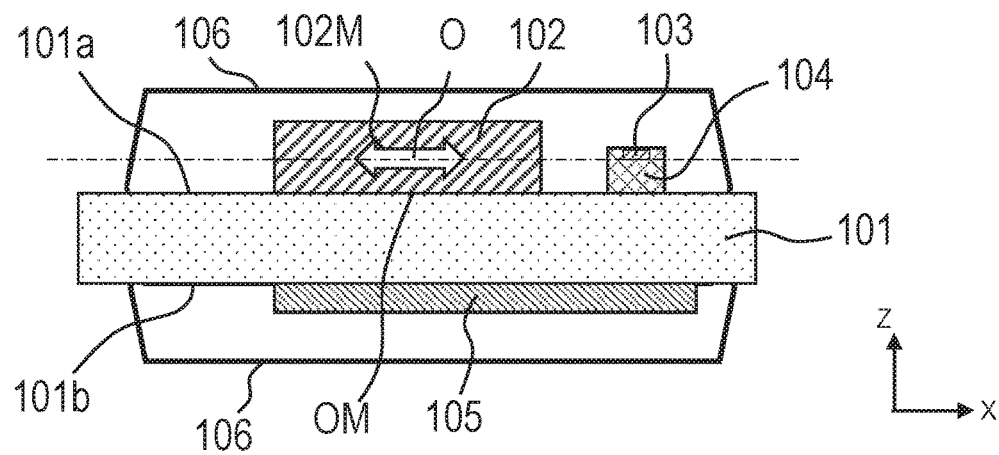

FIG. 1A is a plan view of a magnetic substance detection sensor 100 according to the first embodiment of the present invention. FIG. 1B is a sectional view of the magnetic substance detection sensor 100 of FIG. 1A which is cut by the plane passing through the line LL. The magnetic substance detection sensor 100 at least includes a first support substrate 101 having an upper main surface 101a and a lower main surface 101b which is substantially flat, a magnet 102 which may also be a permanent magnet and a semiconductor chip 104 having a magnetic field detection element 103 both being disposed on the upper main surface 101a of the first support substrate, and a soft magnetic substance film 105 disposed on the surface of the lower main surface 101b of the first support substrate. The surface of the magnetic substance detection sensor 100, particularly, the surface of the magnetic field detection element 103 is preferably covered and sealed with a resin film 106 or the like. The first support substrate 101 may be a printed substrate or a rigid substrate made of a material such as glass epoxy, aluminum, or the like, or may be a flexible substrate made of a resin material or the like or a lead frame made of copper.

Coordinate axes are set in the following manner for convenience of description. The first support substrate 101 and the magnet 102 are respectively rectangular parallelepipeds. The upper main surface 101a of the first support substrate is rectangular, and the magnet 102 and the semiconductor chip 104 are disposed side by side in the long side direction of the rectangle. One of the surfaces of the magnet 102 being in contact with the upper main surface 101a is assumed to be a bottom face of the magnet 102. The magnet 102 is disposed in such a manner that the sides of the magnet 102 being parallel to the upper main surface 101a respectively become parallel to the long or short side of the upper main surface 101a. That is, the four side surfaces surrounding the bottom surface of the magnet 102, and the four side surfaces surrounding the upper main surface 101a become parallel, respectively.

A plane parallel to the upper main surface 101a which passes through the point which bisects the height of the magnet 102 measured perpendicularly from the upper main surface 101a of the first support substrate 101, is an XY plane. An intersection of diagonals of the bottom surface of the magnet 102 is an OM, and a point where the OM is projected onto the XY plane is an origin O. An X-axis is a straight line which extends parallel to the long side from the origin O, and a Y-axis is a straight line which extends parallel to the short side from the origin O. A Z-axis is then a straight line which extends in the direction opposite to the upper main surface 101a from the origin O. The direction parallel to the X-axis is an x direction and −x direction, and the direction including both the x and −x directions is ±x directions. The directions along the Y-axis and the Z-axis are also defined similar to the above.

The magnet 102 is disposed on the upper main surface of the first support substrate 101 so that a magnetization direction 102M becomes parallel to the X-axis. The magnetization direction 102M herein is ±x directions and includes not only a direction from the S pole to the N pole, but also a direction from the N pole to the S pole.

A material of the magnet 102 is not limited in particular, but include, for example, NdFeB, SmCo, or the like.

The semiconductor chip 104 is disposed (placed) on the upper main surface 101a of the first support substrate directly or with a non-magnetic member interposed therebetween so that the magnetic field detection element 103 formed on the surface thereof is on the side (the upper side in FIG. 1) opposite to the first support substrate 101.

The magnetic field detection element 103 has a detection axis along a single direction such as a Hall element and is capable of detecting a magnetic field component in a specific direction. The specific direction in the present embodiment is the z direction which is perpendicular to upper main surface 101a of the first support substrate and is orthogonal to the magnetization direction 102M of the magnet 102.

The soft magnetic substance film 105 is disposed on the lower main surface 101b of the first support substrate and extends in the direction parallel to the magnetization direction 102M of the magnet 102. The soft magnetic substance film 105 preferably overlaps with at least the entire magnet 102 in a plan view from the Z-axis direction. Material of the soft magnetic substance film 105 includes, for example, NiFe, NiFeCu, NiFeMo, or the like and has preferably a high permeability and a small coercivity.

A description will be made as to the operation of the magnetic substance detection sensor of the present embodiment. In the case where a magnetic substance as an object of detection (not illustrated) is sufficiently far from the magnetic field detection element 103, the magnetic field detection element 103 mainly detects a Z-axis direction component B0 of the magnetic field generated from the magnet 102. Here, in the case where the magnetic field detection element 103 is the Hall element, the output from the magnetic field detection element 103 can be obtained as a voltage signal proportional to the Z-axis direction component B0 of the magnetic field.

In the case where the magnetic substance as the object of detection approaches to the magnet 102 from the side (z direction herein) opposite to the first support substrate 101, the magnetic field around the magnetic field detection element 103 changes according to the influence of the magnetic substance. As a result, the magnetic field Bz detected by the magnetic field detection element 103 is different from the magnetic field B0 obtained for the case where the magnetic substance is sufficiently far.

Since the magnetic field Bz detected by the magnetic field detection element 103 changes depending on the distance between the magnetic substance and the magnetic substance detection sensor 100 under the influence of the magnetic substance, the amount of change in the magnetic field (Bz−B0) becomes an index denoting the distance between the magnetic substance and the magnetic substance detection sensor 100. Incidentally, the output signal of the magnetic field detection element 103 can be processed by a prescribed circuit as needed. The processing of the output signal herein may be, for example, a determination for magnitude with a predetermined magnetic field Bc or may be amplification of an output voltage.

In the conventional magnetic substance detection sensor, the problem arises in that the operating point of the magnetic substance detection sensor is shifted due to the material of a peripheral structure or the like so that the obtained detection distance varies. Described more specifically, the problem arises in that both the magnetic fields Bz and B0 detected by the magnetic field detection element 103 change depending on whether the peripheral structure is of a magnetic substance or a non-magnetic substance. On the other hand, in the magnetic substance detection sensor 100 of the present embodiment, the soft magnetic substance film 105 is disposed on the side opposite to the magnet 102 with the first support substrate 101 interposed therebetween, and hence the influence of the material of the peripheral structure or the like can be shielded. For that reason, as will be described later as an embodiment, the magnetic field detected by the magnetic field detection element 103 is made stable regardless of the material of the peripheral structure or the like.

Accordingly, in the present embodiment, there can be realized the magnetic substance detection sensor 100 in which the soft magnetic substance film 105 is disposed parallel to the magnetization direction 102M of the magnet 102 and is disposed on the wall surface, i.e., the object of detection is hence disposed on the opposite side of the soft magnetic substance film 105, so that suppression of the shift of the operating point due to the influence of the peripheral structure such as the material of the wall surface or the like and correct detection of the proximity of the magnetic substance are possible.

The semiconductor chip 104 which constitutes the magnetic substance detection sensor 100 of the present embodiment can be manufactured by a general CMOS process which uses a wafer such as silicon or the like for a semiconductor substrate. The magnetic field detection element 103 can be formed by implanting an impurity ion such as a phosphor atom from the upper main surface of the semiconductor substrate. The circuit which processes the output from the magnetic field detection element 103 can also be formed on the same semiconductor substrate by a common CMOS process. The semiconductor chip 104 can be obtained by performing a back-grinding and dicing after the wafer process.

Next, the semiconductor chip 104 and the magnet 102 are adhered to the upper main surface 101a of the first support substrate such as the printed substrate or the like, and the soft magnetic substance film 105 is adhered to the lower main surface 101b. The soft magnetic substance film 105 may be formed not only on the area where it overlaps with the magnet 102 within the lower main surface 101b, but also on its entire area. Thereafter, the magnet 102, the semiconductor chip 104, and the soft magnetic substance film 105 may be sealed with the resin film 106 as needed.

Although the present embodiment has exemplified the case where the semiconductor chip 104 is directly adhered to the first support substrate 101, a semiconductor chip 104 sealed in a package may be adhered thereto. In this case, for example, a printed substrate is used as the first support substrate 101, and the package including the semiconductor chip 104 is mounted by reflow. Afterwards, the magnet 102 may be adhered to the first support substrate 101 by an epoxy resin. The soft magnetic substance film 105 can be formed by, for example, adhesion of a film formed by the epoxy resin, prepreg or the like, deposition of a film by sputtering, etc.

Second Embodiment

Figure 2A:
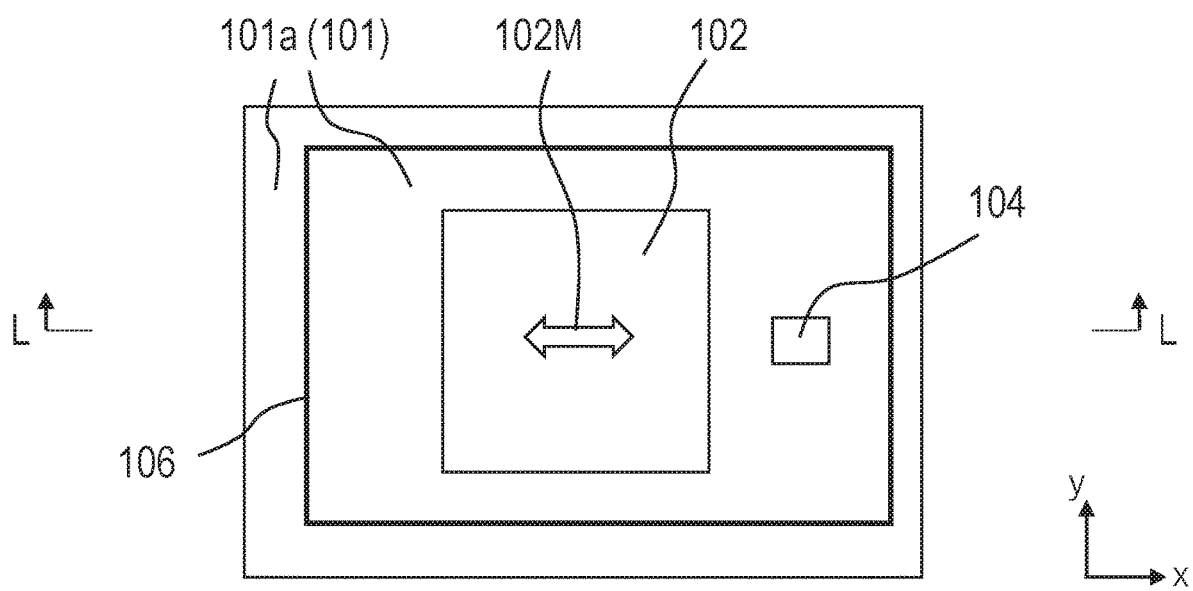
FIGS. 2A and 2B are respectively a plan view and a sectional view of a magnetic substance detection sensor according to the second embodiment of the present invention.
Figure 2B:
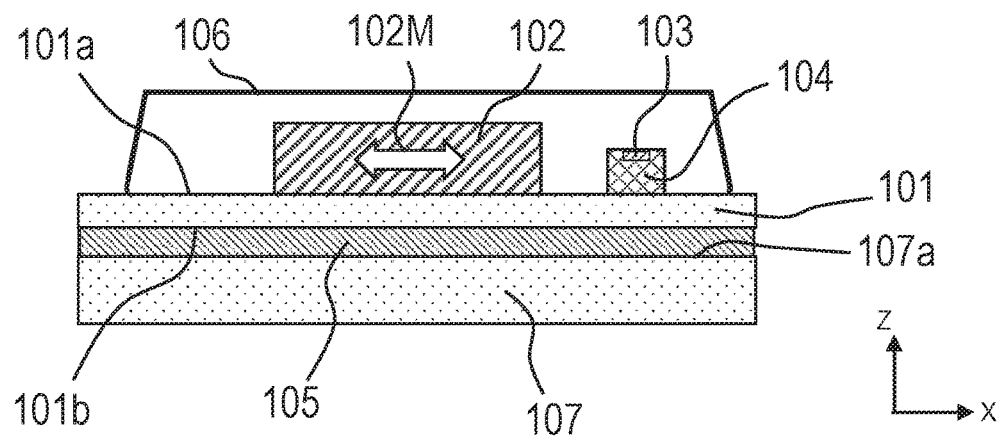

FIG. 2A is a plan view of a magnetic substance detection sensor 200 according to the second embodiment of the present invention. FIG. 2B is a sectional view of the magnetic substance detection sensor 200 of FIG. 2A which is cut by the plane passing through the line LL. In the magnetic substance detection sensor 200, the upper main surface 107a of the second support substrate 107 is bonded to the lower main surface 101b of a first support substrate with a soft magnetic substance film 105 interposed therebetween. Other parts of the configuration are similar to those in the magnetic substance detection sensor 100 of the first embodiment, and are denoted by the same reference numerals regardless of differences in shape.

In the second embodiment, the magnetic substance detection sensor 200 can be made thin by the absence of the resin film since the soft magnetic substance film 105 is sandwiched between the first support substrate 101 and the second support substrate 107 for protection. As the second support substrate 107, for example, a Bakelite plate, an aluminum substrate, or the like can be used. The bonding of the second support substrate 107 can be performed by, for example, adhering the soft magnetic substance film 105 to the surface of the second support substrate 107 or depositing the same thereon by sputtering, and thereafter bonding the soft magnetic substance film 105 to the first support substrate 101 so as to interpose the soft magnetic substance film 105 between the second support substrate 107 and the first support substrate 101.

Third Embodiment

Figure 3A:
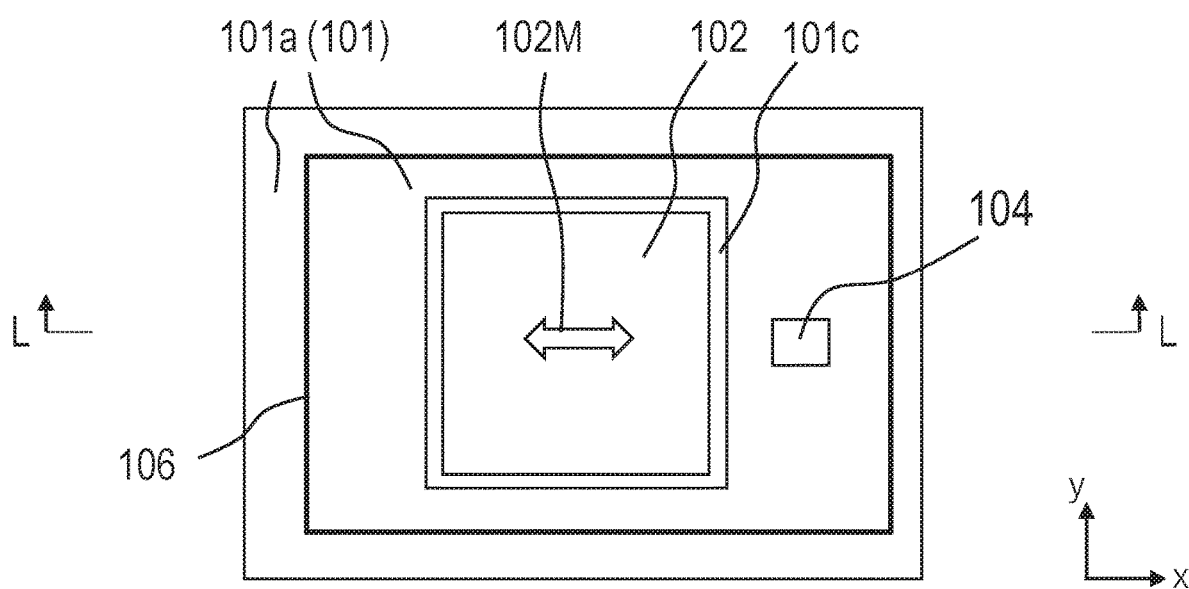
FIGS. 3A and 3B are respectively a plan view and a sectional view of a magnetic substance detection sensor according to the third embodiment of the present invention.
Figure 3B:
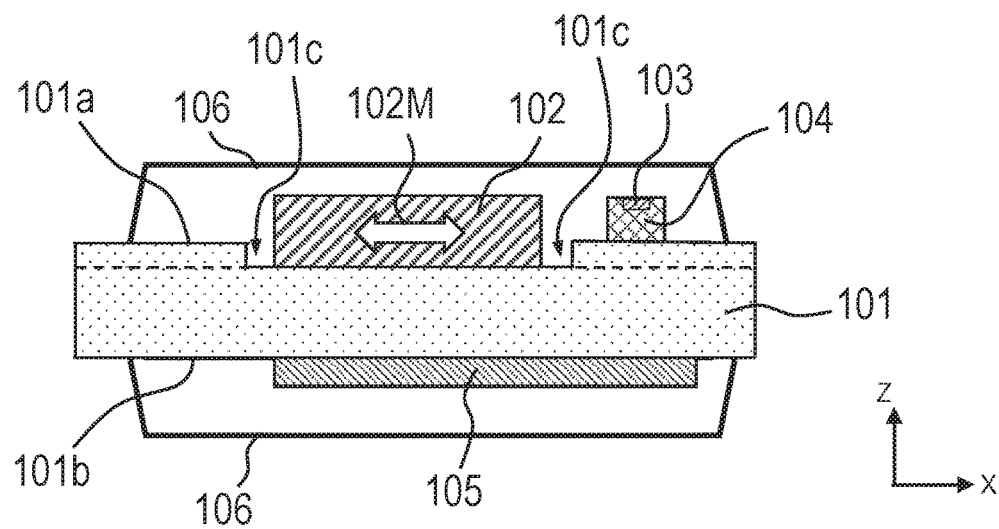
Figure 4A:
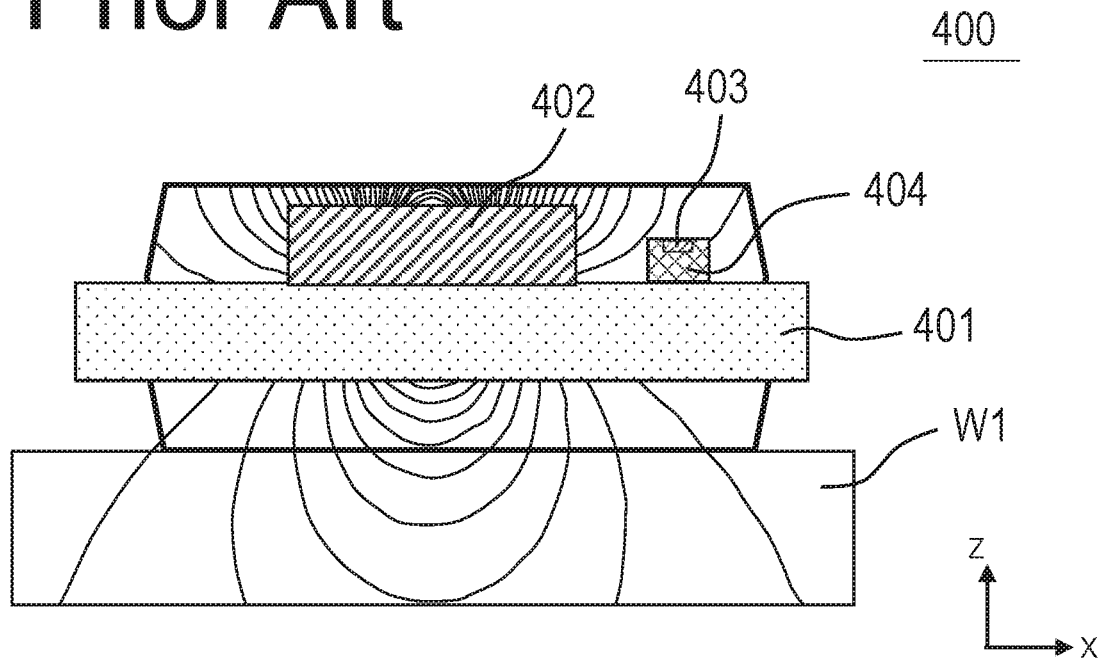
FIGS. 4A and 4B are respectively diagrams describing the influence of peripheral magnetic fields on a magnetic substance detection sensor having a conventional structure.
Figure 4B:
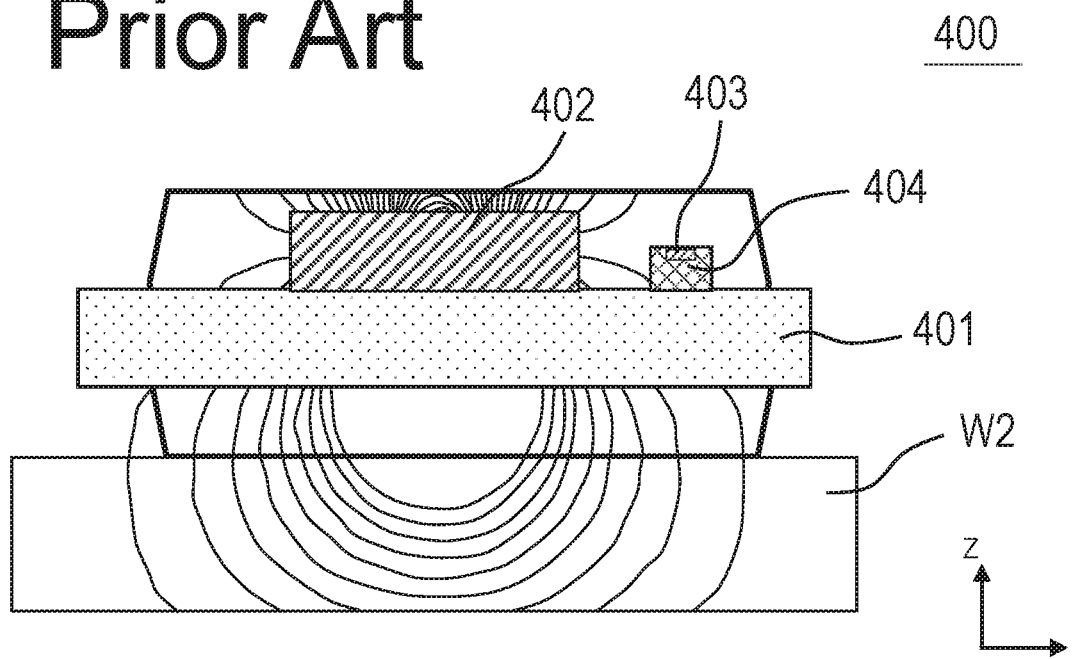

FIG. 3A is a plan view of a magnetic substance detection sensor 300 according to the third embodiment of the present invention. FIG. 3B is a sectional view of the magnetic substance detection sensor 300 of FIG. 3A which is cut by the plane passing through the line LL. The magnetic substance detection sensor 300 has a recess 101c defined in the upper main surface 101a of the first support substrate 101. The side walls of the recess 101c may be integral with the first support substrate or may be formed from other material. A magnet 102 is disposed within the recess 101c, and a semiconductor chip 104 is disposed outside the recess 101c. Other parts of the configuration are similar to those in the magnetic substance detection sensor 100 of the first embodiment, and are denoted by the same reference numerals regardless of differences in shape.

In the third embodiment, a part of the magnet 102 in its thickness direction (z direction) is held in the recess 101c, and correspondingly, the magnet 102 can be made thick. As a result, it is possible to increase the magnetic field detected by the magnetic field detection element 103.

Also, in the case where a magnetic substance (not illustrated) as an object of detection approaches or goes away in the z direction, the amount of change (Bz-B0) in the magnetic field detected by the magnetic field detection element 103 becomes large as the magnetic field detection element 103 separates in the z direction from the X-axis, thereby making it possible to enhance the sensitivity of the magnetic substance detection sensor 300.

Further, in the third embodiment, since the magnet 102 can be disposed along the recess 101c, it is possible to improve the accuracy of arrangement thereof in an XY plane as compared with the first embodiment and the second embodiment. As a result, the accuracy of detection of the magnetic substance by the magnetic substance detection sensor can be further enhanced.

The recess 101c of the first support substrate can be obtained by thinning a single printed substrate or by forming a through hole equivalent to the recess 101c in the first substrate and sticking the same to the second substrate. Here, as the first substrate, for example, a rigid substrate or a flexible substrate can be used, and as the second substrate, for example, a rigid substrate can be used.

Example 1

Advantageous effects of the present invention will be made more obvious below by the example 1. Incidentally, the present invention is not limited to the following example 1 and can be appropriately changed and implemented within the scope not modifying the gist thereof.

As the example 1 of the present invention, the magnetic substance detection sensor 100 of the first embodiment is used, and simulation based on a two-dimensional finite element method is performed on the magnitudes of magnetic fields detected by the magnetic field detection element 103 for the case where the material of the wall along the soft magnetic substance film 105 is a non-magnetic substance and for the case where the material is a soft magnetic substance. Also, as a comparative example 1 for the present invention, similar simulation was performed on the magnetic substance detection sensor of the conventional structure having no soft magnetic substance film 105. The dimensions of a magnet are assumed to be 4 mm in the x direction and 1 mm in the z direction. As the magnetic field detection element, an element (Hall element, for example) having sensitivity with respect to only a magnetic field component in the z direction is used. Further, the thickness of the soft magnetic substance film is assumed to be 0.5 mm, and the distance from the bottom face of the magnet to the soft magnetic substance film is assumed to be 1.5 mm. The distance from the bottom face of the magnet to the surface of the wall is assumed to be 2.5 mm. Respective results of simulation are illustrated in Table 1.

TABLE 1

| Magnitude of magnetic field (mT) | | Comparative example 1 | | Example 1 | |
|---|---|---|---|---|---|
| B0: Magnetic field in presence of magnetic substance Bz: Magnetic field in absence of magnetic substance | | B0 | Bz | B0 | Bz |
| Material of wall surface | Soft magnetic substance | 0.1 | 3.6 | −0.1 | 3.0 |
| | Non-magnetic substance | −10.1 | −7.3 | −0.1 | 3.0 |

In the magnetic substance detection sensor of the comparative example 1, both magnetic fields Bz and B0 to be detected change about 10 mT where the material of a wall surface is a non-magnetic substance and where the material is a soft magnetic substance. On the other hand, in the magnetic substance detection sensor of the example 1, the detected magnetic field becomes constant regardless of differences in the wall surface material. More specifically, even in the case where the wall surface material is non-magnetic and soft-magnetic, the same value is obtained for the magnetic fields Bz and B0. As a result, the same amount of change in the magnetic field is obtained. This indicates that no operating point is shifted upon detection of the magnetic substance and that stable detection independent of the wall surface material can be performed.

Further, in the comparative example 1, the magnetic field change (Bz-B0) caused by the presence or absence of the magnetic substance being the object to be detected becomes 3.5 mT where the material of the wall surface is non-magnetic and become 2.8 mT where the material of the wall surface is soft-magnetic, and the sensitivity of the magnetic substance detection sensor changes depending on the material of the wall surface. On the other hand, in the example 1, the magnetic field change is 3.1 mT regardless of the material of the wall surface, and the sensitivity of the magnetic substance detection sensor becomes free from the influence of the wall surface material by arranging the soft magnetic substance film 16.

It is understood from these results that there can be realized the magnetic substance detection sensor in which the soft magnetic substance film 105 is disposed on the wall surface side in parallel to the magnetization direction 102M of the magnet 102 to thereby suppress the operating point from being shifted upon detection of the magnetic substance even if the influence to the peripheral magnetic field due to the differences in the wall surface material or the like exists.

What is claimed is:

1. A magnetic substance detection sensor comprising:
   a first support substrate having an upper main surface and a lower main surface;
   a magnet disposed on the upper main surface of the first support substrate so that a magnetization direction is parallel to the upper main surface;
   a semiconductor chip disposed on the upper main surface of the first support substrate and having a magnetic field detection element configured to detect a magnetic field component in a specific direction; and
   a soft magnetic substance film disposed on a lower main surface of the first support substrate and extending in a direction parallel to the magnetization direction of the magnet.

2. The magnetic substance detection sensor according to claim 1, wherein the specific direction of the magnetic field detection element is orthogonal to the magnetization direction of the magnet.

3. The magnetic substance detection sensor according to claim 1, wherein an upper main surface of a second support substrate is bonded to the lower main surface of the first support substrate with an interposition of the soft magnetic substance film.

4. The magnetic substance detection sensor according to claim 2, wherein an upper main surface of a second support substrate is bonded to the lower main surface of the first support substrate with an interposition of the soft magnetic substance film.

5. The magnetic substance detection sensor according to claim 1, wherein the magnetic substance detection sensor has a recess defined on the upper main surface of the first support substrate, and
   wherein the magnet is disposed within the recess, and the semiconductor chip is disposed outside the recess.

6. The magnetic substance detection sensor according to claim 2, wherein the magnetic substance detection sensor has a recess defined on the upper main surface of the first support substrate, and
   wherein the magnet is disposed within the recess, and the semiconductor chip is disposed outside the recess.

7. The magnetic substance detection sensor according to claim 3, wherein the magnetic substance detection sensor has a recess defined on the upper main surface of the first support substrate, and
   wherein the magnet is disposed within the recess, and the semiconductor chip is disposed outside the recess.

8. The magnetic substance detection sensor according to claim 4, wherein the magnetic substance detection sensor has a recess defined on the upper main surface of the first support substrate, and
   wherein the magnet is disposed within the recess, and the semiconductor chip is disposed outside the recess.

* * * * *